United States Patent [19]

Fujino

[11] Patent Number: 5,212,028
[45] Date of Patent: May 18, 1993

[54] FABRICATION OF FINE PATTERNS BY SELECTIVE SURFACE REACTION AND INSPECTION METHOD THEREFOR

[75] Inventor: Takeshi Fujino, Hyogo, Japan

[73] Assignee: Mitsubishi Denki Kabushiki Kaisha, Tokyo, Japan

[21] Appl. No.: 657,785

[22] Filed: Feb. 20, 1991

[30] Foreign Application Priority Data

Feb. 26, 1990 [JP] Japan .................. 2-46263

[51] Int. Cl.$^5$ .............................. G03C 5/00
[52] U.S. Cl. ........................... 430/22; 430/311; 430/319
[58] Field of Search ................. 430/22, 311, 319

[56] References Cited

U.S. PATENT DOCUMENTS

| | | | |
|---|---|---|---|
| 3,555,172 | 1/1971 | Heinz ..................... | 430/22 |
| 3,742,229 | 6/1973 | Smith et al. .............. | 430/22 |
| 4,109,029 | 8/1978 | Ozdemir et al. ........... | 430/319 |
| 4,356,223 | 10/1982 | Iida et al. ............... | 430/22 |
| 4,407,933 | 10/1983 | Fraser et al. ............ | 430/22 |
| 4,642,672 | 2/1987 | Kitakata ................. | 430/22 |

OTHER PUBLICATIONS

"Desire: A Novel Dry Developed Resist System", Advances in Resist Technology and Processing III, by Fedor Coopmans and Bruno Roland, 1986.

"The Pattern Fabrication by Sililation Process", 1988 Dry Process Symposium, by S. Ito et al., pp. 69-73, Oct. 24-25, 1988.

"New Dry Developed Positive Working System for E-Beam and Deep U.V. Lithography", The 33rd International Symposium on Electron, Ion and Photon Beams, May 30-Jun. 2, 1989, C. Pierrat et al.

"Polymer Surfaces: Their Role in High Resolution Imaging", Polymers for Microelectronics-Science and Technology, by Gary N. Taylor et al., p. 32, 1989.

*Primary Examiner*—Marion E. McCamish
*Assistant Examiner*—Mark A. Chapman
*Attorney, Agent, or Firm*—Lowe, Price, LeBlanc & Becker

[57] ABSTRACT

Disclosed is a method of fabricating a fine pattern by using selective surface reaction such as silylation reaction. A resist for dry development is applied on a semiconductor wafer having an alignment mark formed at a predetermined reference position and comprising a stepped portion. By selectively irradiating the resist by ultraviolet light or electron beams in accordance with a predetermined pattern with reference to the position of the alignment mark, the pattern is transferred onto the resist. A silylated layer of high etching-resistant is selectively formed in a surface of the resist by causing silylation reaction at least in a region of the alignment mark and either a region irradiated by energy beams or a non-irradiated region. This is induced by irradiation of the electron beams or the ultra-violet light, and resulted from the resist heated to a predetermined temperature. Thereafter, before developing the pattern transferred onto the resist, by scanning the resist in a region including at least the alignment mark with the electron beams, the registration of the pattern with the semiconductor wafer is checked. The check of the registration is performed by detecting electrons reflected from the alignment mark and an Auger electrons emitted from the silicon atoms in the silylated layer. The resist can be removed without damaging the underlying substrate even if out-of-registration is detected.

15 Claims, 10 Drawing Sheets

FABRICATION OF FINE PATTERNS BY SELECTIVE SURFACE REACTION AND INSPECTION METHOD THEREFOR

BACKGROUND OF THE INVENTION

1. Field of the Invention

The present invention relates generally to fabrication of fine patterns for use in fabricating patterns for a semiconductor device and inspection method therefor, and more particularly to fabrication of fine patterns by selective surface reaction and inspection method therefor.

2. Description of the Background Art

In recent years, with miniaturization of semiconductor devices, resist pattern fabricating process by using selective surface reaction and development by dry etching has been developed as a method of fabricating a fine resist pattern having pattern width on the order of submicron. This resist pattern fabricating process is expected as a resist pattern fabricating process of the next generation because of the following advantages as compared with a conventional fine pattern fabricating method using resist and developer.

As a representative of such resist pattern fabricating process as described above, DESIRE (Diffusion Enhanced Silylating Resist) process is reported in "DESIRE: a novel dry developed resist system" by Coopmans and B. Roland, SPIE Proc., 631,34 (1986).

(i) The depth-of-focus is increased under the ultraviolet light exposure, resulting in susceptibility to the effect of an underlying substrate on which a resist pattern is formed.

(ii) Under for ultra-violet light exposure such as excimer laser, deterioration of a pattern shape can be prevented resulted from the fact that energy absorption of a resist is so large that the exposure can not be done to a bottom portion of the resist.

(iii) Under electron beam exposure, blur of a pattern due to dispersion of the electron beam in the resist can be eliminated.

A description will be given of a case in which the DESIRE process is applied to pattern transfer by the ultra-violet light exposure. FIGS. 9A through 9E are partially sectional views showing sequential steps of a method of fabricating a pattern in case the DESIRE process is applied in fabricating a fine pattern by the ultraviolet exposure.

Figure 9A:
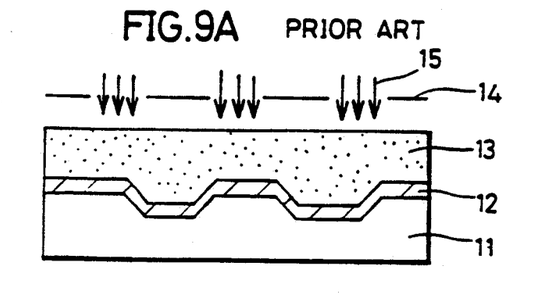
FIGS. 9A, 9B, 9C, 9D and 9E are partially sectional views showing sequential steps of forming a fine pattern by using ultra-violet ray exposure according to the prior art.
Figure 9B:
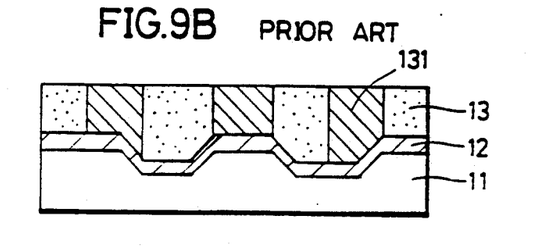

Referring to FIG. 9A a predetermined film 12 is formed over a silicon substrate 11. A resist 13 for dry development is spin-coated over the film 12. As a resist for dry development, PLASMASK resist, a product of Japan Synthetic Rubber, for example. Dry development is a method of developing a resist by using oxygen plasma and the like while ordinarily it is developed by using organic solvent and alkaline solution. The resist for dry development is a special resist formed of a material suitable for the above-described dry development. The resist 13 for dry development is selectively irradiated by ultra-violet light 15 of a wavelength of 436 nm or 360 nm through a mask 14. As the foregoing, as a result of the formation of a portion 131 exposed to the ultra-violet light in the resist 13 as shown in FIG. 93, a pattern of the predetermined mask 14 is transferred onto the resist.

Figure 9C:
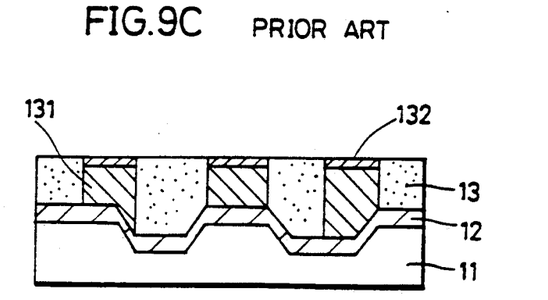

Referring to FIG. 9C, a silylated portion 132 is formed on a surface of the portion 131 exposed to the ultra-violet light by the silylation treatment. The silylation treatment is carried out by introducing the substrate maintained at the temperature of 100°-180° C. into nitrogen carrier gas atmosphere containing hexamethyldisilazane (HMDS). The hexamethyldisilazane is referred to as silylating reagent. The hexamethyldisilazane selectively diffuses in the portion 131 exposed to the ultra-violet ray to cause silylation. Schematically, the silylation is carried out as the following.

In the portion 131 exposed to the ultra-violet light in the resist, quinondiazides contained as a photosensitive material in the resist changes into indene carboxylic acid. Therefore, under the heating at the above-described temperature, crosslinking reaction of the novolak resin included in the resist occurs more remarkably in the non-exposed portion than in the exposed portion 131. As a result, the HMDS as the silylating reagent easily enters the portion 131 exposed to the ultra-violet light, so that silylation reaction between the novolak resin and the HMDS occurs, that is, molecules including silicon atoms enters the surface portion of the portion 131 exposed to the ultra-violet light, thereby forming the silylated portion 132. The silylation treatment is described in detail in "THE PATTERN FABLICATION BY SILILATION (SILYLATION) PROCESS" PP. 69-73 by S. Ito et al, 1988 Dry Process Symposium .

Figure 9D:
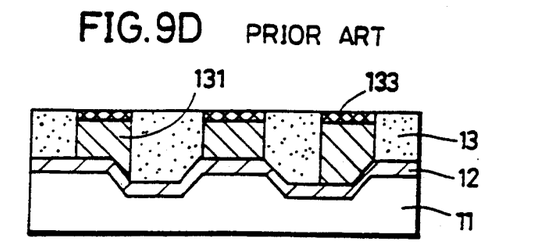
Figure 9E:
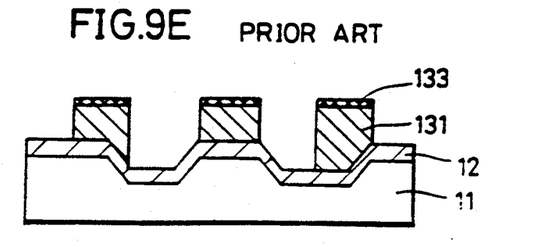

As shown in FIG. 9D, the silylated portion 132 changes into a silicon oxide film 133 by the introduction of the substrate into anisotropic oxygen plasma. Then, as shown in FIG. 9E, only the non-exposed portion is selectively removed in the anisotropic oxygen plasma to be dry developed. As the foregoing, the selective removal of the resist is carried out by using the selectively silylated portion in the surface portion of the resist as a mask. As a result, a fine pattern formed of a negative type resist is obtained.

FIGS. 10A through 10D are partially sectional views showing sequential steps of fabricating a resist pattern when the above-described DESIRE process is applied to a resist pattern fabricating process by the electron beam exposure. The resist pattern fabricating process is reported in "PRIME; New Dry Developed Positive Working System for E-beam and Deep U.V. Lithography" by C. Pierrat et al., at 3-Beam Conference (June, 1989) in Montery (U.S.A.)

Figure 10A:
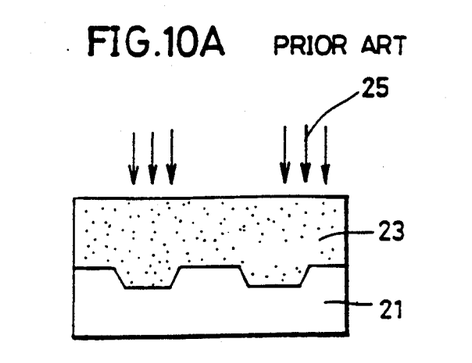
FIGS. 10A, 10B, 10C and 10D are partially sectional views showing sequential steps of manufacturing a fine pattern by using electron beam exposure according to the prior art.
Figure 10B:
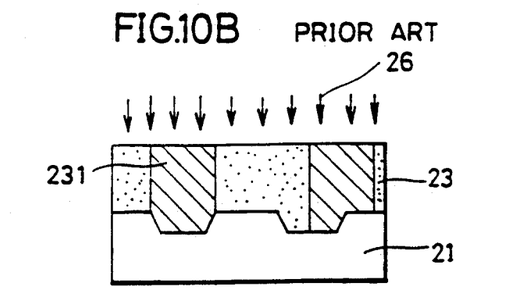

Referring to FIG. 10A, a resist 23 for dry development is spin-coated over a substrate 21. A predetermined pattern is drawn on the resist 23 for dry development by electron beams 25. Referring to FIG. 10B, a portion 231 exposed to the electron beams is formed in the resist 23 for dry development. Thereafter, the entire resist 23 is irradiated with ultra-violet light 26. As a result, the portion 231 exposed to the electron beams is crosslinked by the electron beams and a portion nonexposed to the electron beams which is exposed only to the ultra-violet light in the resist 23 changes into a substance hard to be crosslinked.

Figure 10C:
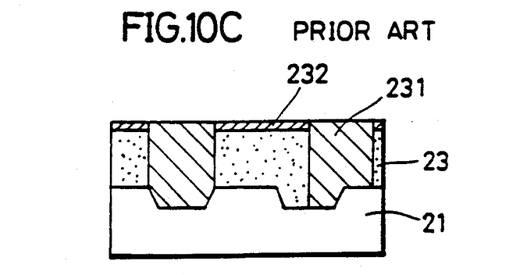
Figure 10D:
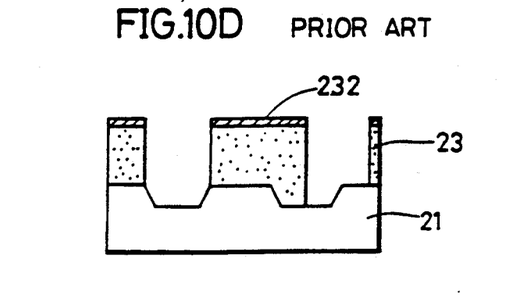

Thereafter, as shown in FIG. 10C, in the silylation process, the silylating reagent, that is, the molecules containing silicon atoms penetrates the non-exposed portion. As a result, a silylated portion 232 is formed on the surface of the non-exposed portion (the portion irradiated only with the ultra-violet rays). Referring to FIG. 10D, for example, by the reactive ion etching process in the anisotropic oxygen plasma, a portion of the resist to which no silicon atom penetrates, that is, the exposed portion 231 is selectively removed. As the foregoing, as a result of the selective etching of only the portion irradiated with the electron beams, a positive type fine resist pattern is fabricated.

In fabricating a pattern for a semiconductor device, normally another pattern is registered with respect to one pattern formed on an underlying substrate. The registration is carried out by detecting an alignment mark formed on the underlying substrate in scanning predetermined energy beam such as laser beam and electron beam.

However, in a such case where the detection is not properly performed in scanning the alignment mark, the upper layer pattern becomes out of register with the underlying substrate. If the succeeding steps are sequentially carried out with the resist pattern out of register to manufacture a semiconductor device, the manufactured semiconductor device is not capable of operating normally. In order to avoid this, the registration accuracy is checked at the stage of the formation of the resist pattern by using a device for measuring minute dimensions, for example, LAMU-600. In checking the registration accuracy, if it is detected that the pattern is out of register, it is necessary to remove the fabricated resist pattern and apply an additional register on the substrate to newly form a pattern.

In case of a resist pattern fabricated by using conventional resist and developer, since the resist is formed of an organic substance containing carbon, oxygen and hydrogen as main components, it is easily removed through the exposure to the oxygen plasma atmosphere. However, in the case of the resist pattern fabricated by the DESIRE process as described above, since the silicon atoms diffuse on the surface of the resist left a the pattern, the resist can not be easily removed just by exposing the resist pattern to the oxygen plasma atmosphere. This is because while the main components, carbon, oxygen and hydrogen constituting the resist are easily oxidized and evaporated in the oxygen plasma, the silicon atoms are caked as oxide by the oxidation. Then, in order to remove the silicon atoms contained in the resist, the resist pattern needs to be exposed in plasma atmosphere having fluorine atoms such as $CF_4$.

However, if the exposed surface of the underlying substrate of the resist pattern is exposed in the plasma atmosphere having the fluorine atoms in order to remove the resist, the elements of the semiconductor device containing a lot of silicon atoms such as silicon and silicon oxide ($SiO_2$) formed on the underlying substrate are damaged. Therefore, in case the resist pattern fabricated by using the above-described DESIRE process is out of register, it is difficult to remove the resist by using the plasma.

SUMMARY OF THE INVENTION

One object of the present invention is to enable a resist removal without damaging an underlying substrate when a pattern is detected to be out of register in a method of fabricating a fine pattern by using selective surface reaction.

Another object of the present invention is to improve the procedure for checking registration accuracy of a pattern in a method of fabricating a fine pattern by using selective surface reaction.

A further object of the present invention is to improve the fabrication of a fine pattern having a pattern width on the order of submicron without causing out-of-registration.

A still further object of the present invention is to enable the inspection of fine patterns before the development of the patterns.

Another object of the present invention is to improve the procedure for checking registration accuracy of a pattern in an inspection method for a fine pattern including a surface layer formed by selective surface reaction.

In accordance with a method of fabricating a fine pattern according to the present invention, first a resist is applied on a major surface of a substrate at least comprising an alignment mark formed at a predetermined reference position and having a stepped portion. By selectively radiating energy beams onto the resist in accordance with a predetermined pattern with reference to the position of the alignment mark, the pattern is transferred onto the resist. A surface layer of high etching-resistant is selectively formed in the surface of the resist. After the formation of the surface layer and before developing the pattern transferred onto the resist, registration of the alignment mark position with the position of the surface layer formed in the alignment mark region is checked by scanning the resist in a region at least including the alignment mark by the electron beams. The pattern transferred on the resist is developed by selectively removing the resist by using the surface layer as a mask.

According to a preferred embodiment of the present invention, formation of the surface layer is performed by fabricating a surface layer highly resistant to etching with respect to the oxygen plasma by causing the silylation such that the silicon atoms selectively penetrate the surface of the resist. The selective penetration of the silicon atoms into the surface of the resist is induced by the irradiation of the energy beams. The irradiation of the energy beams is carried out by selectively irradiating the ultra-violet light in a step of transferring the pattern onto resist, or by irradiating the whole surface with the ultra-violet light after the selective irradiation of the electron beams. The process of developing the pattern transferred onto the resist is carried out by etching the resist in anisotropic oxygen plasma atmosphere. The etching is carried out based on the reactive ion etching. Checking the registration is carried out by detecting the position of the surface layer through the detection of Auger electrons emitted from the silicon atoms penetrated the surface of the resist and by detecting the alignment mark position trough the detection of reflected electrons from the stepped portion forming the alignment mark.

In the present invention, registration of the resist pattern with the underlying substrate is checked by scanning the resist in the alignment mar): region by the electron beams before developing the pattern transferred onto the resist. Checking the registration is carried out by the registration of the alignment mark position with a position of the high etching-resistant surface layer formed in the alignment mark region. Therefore, there is no need for checking the registration of the pattern at a stage after the development wherein the resist pattern is fabricated. As a result, if out-of-register is detected, the resist can be removed before developing the pattern transferred onto the resist. Accordingly, the resist can be removed before the exposure of the surface of the underlying substrate by the development of the pattern, so that even if the resist removal is carried out by the plasma using both the gas plasma containing fluorine atoms such as the mixtured plasma of $CF_4$ and the oxygen, no damage is caused on the underlying substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
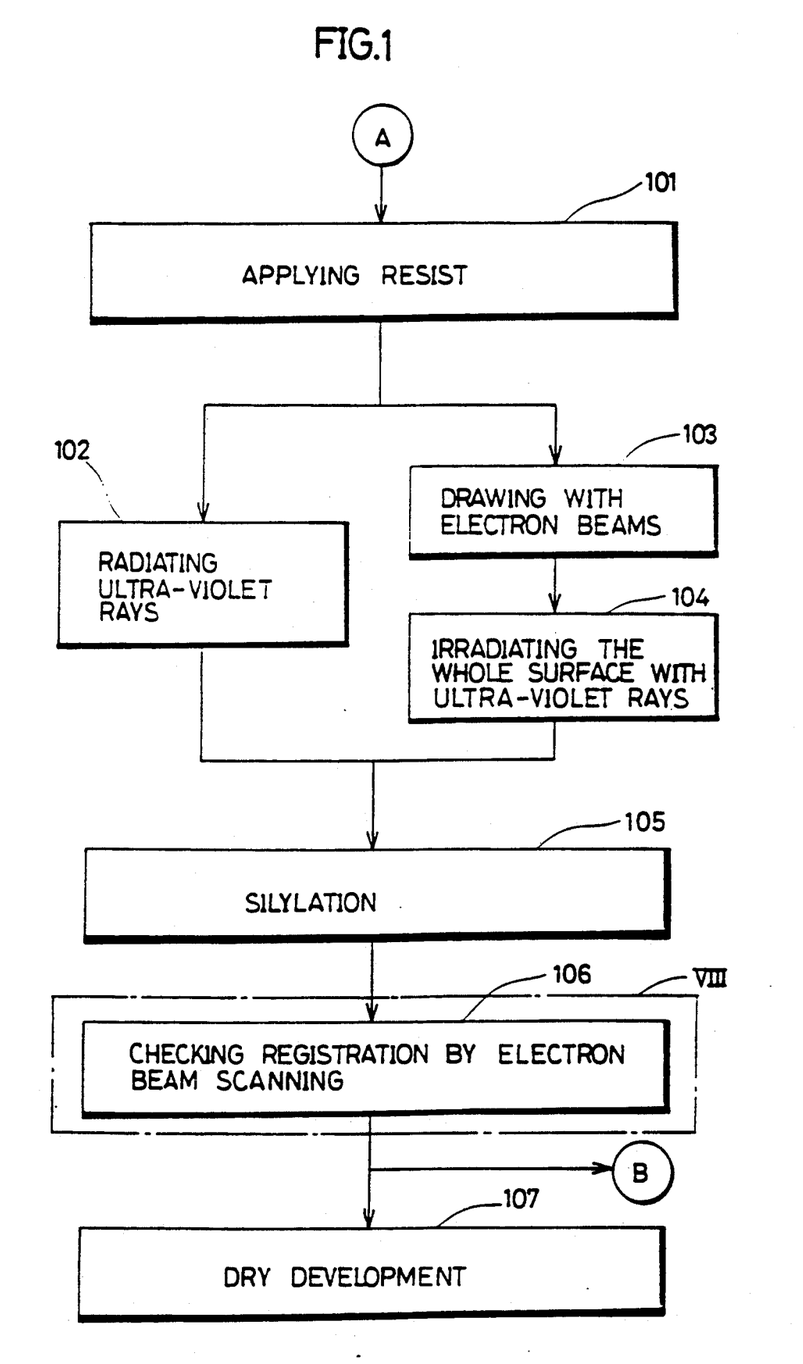
FIG. 1 is a flow chart sequentially showing a method of fabricating a fine pattern according to the present invention.
Figure 2:
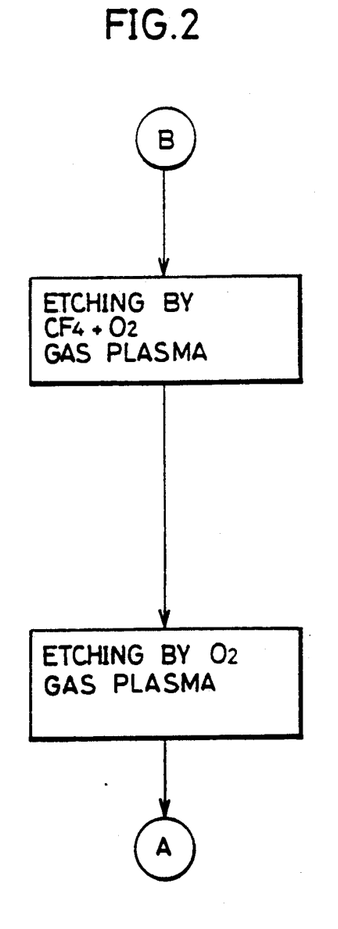
FIG. 2 is a flow chart showing steps of removing a resist when out-of-register is detected in checking the registration accuracy according to the present invention.

Referring to FIG. 1, the respective steps other than the step indicated by VIII are the same as the conventional steps of fabricating a fine pattern by ultraviolet exposure shown in FIGS. 9A through 9E and the conventional steps of fabricating a fine pattern by electron beam exposure shown in FIGS. 10A through 10D.

As shown in FIG. 1, a resist for dry development, for example, a PLASMASK resist, a product of Japan Synthetic Rubber is spin-coated on a surface of a substrate (Step 101). The substrate on which the resist is coated is prebaked at a temperature of 70°-100° C. In case of transferring a pattern onto the resist by the ultra-violet exposure, the ultra-violet light is radiated onto the surface of the resist with dose of about 100-1000 mJ/cm$^2$ through a mask having a predetermined pattern (Step 102). In case of transferring the pattern onto &he resist by the electron beam exposure, the pattern is drawn on the resist by using the electron beams with dose of about 10-100 $\mu$C/cm$^2$ (Step 103). On this occasion, in order to change the non-exposed portion of the resist into a substance which is hard to be crosslinked, the ultra-violet light is radiated onto the whole surface of the resist with dose of 100-1000mJ/cm$^2$ (Step 104). In the above-described exposure, the registration of the mask with the pattern fabricated on the underlying substrate in the previous step is carried out by watching the alignment mark comprising a stepped portion of about 1.0 $\mu$m formed in the underlying substrate as will be described later or by detecting reflected light and reflected electrons from the stepped portion by photoscanning and electron beam scanning. For example, in transferring the pattern by the exposure of the electron beams, the position of the alignment mark can be easily detected by scanning the alignment mark by the electron beams having energy of about 20 keV to detect the reflected electron image from the stepped portion. The pattern is drawn by the electron beams with respect to this detected position.

After the transfer of the pattern onto the resist by the predetermined energy beams, the silylation process is performed by exposing the surface of the resist in the nitrogen gas atmosphere containing HMDS with the substrate maintained at the temperature of 100°-180° C. (Step 105). As a result, the silicon atoms penetrate into only the surface exposed to the ultra-violet light of the resist in the case of the ultra-violet light exposure, and into only the surface non-exposed to the electron beam of the resist in the case of the electron beam exposure.

After the sililation process, the registration accuracy is checked by the electron beam scanning in the anisotropic oxygen plasma (Step 106) before the dry development (Step 107) by, for example, the reactive ion etching on the like. The method of checking the registration accuracy will be described in detail later.

When it is detected that the pattern is out of registration by the above-described check of the registration, the resist will be removed in a manner as follows. Steps of removing the resist are performed in accordance with the step B shown in FIG. 1B.

Referring to FIGS. 2 and 3A through 3C, a method of removing the resist will be described.

Figure 3A:
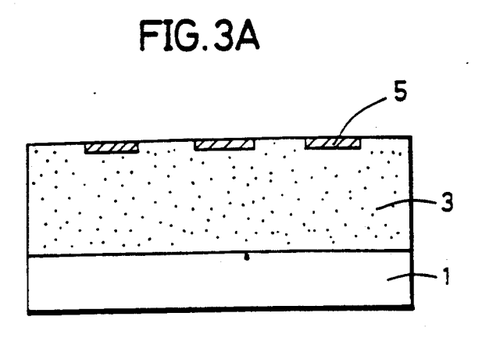
FIGS. 3A, 3B and 3C are partially sectional views showing steps of removing the resist in accordance with FIG. 2.

Referring to FIG. 3A, a resist 3 for dry development is formed on an underlying substrate 1. Formed on a surface portion of the dry development resist 3 are selectively silylated portion 5. The portion 5 wherein the silicon atoms exist due to the selective silylation have a depth of 0.2-0.4 $\mu$m from the surface of the resist 3. The depth to which the silicon atoms penetrate is smaller than the total thickness 1-2 $\mu$m of the resist and the penetrated silicon atoms do not each the underlying substrate.

Figure 3B:
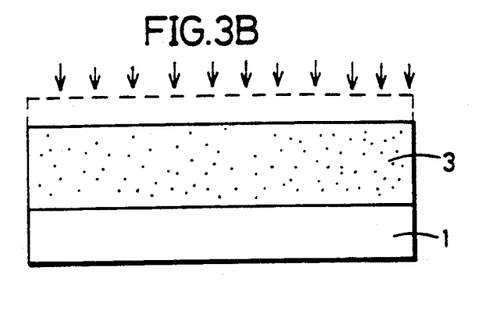

Now, referring to FIG. 3B, first, ar upper layer of the resist including the silicon atoms is removed. The removal of the upper layer of the resist is carried out in plasma atmosphere, for example, in CF$_4$+O$_2$ gas including fluorine radical capable of removing the silicon. This process is carried out by controlling the etching time period until at least the portion 5 including the silicon atoms due to the sililation is removed. While some of the resist is etched in the etching process, so that the film thickness thereof is reduced, the underlying substrate 1 never be damaged by the fluorine radical because the surface of the underlying substrate 1 is all covered with the resist 3.

Figure 3C:
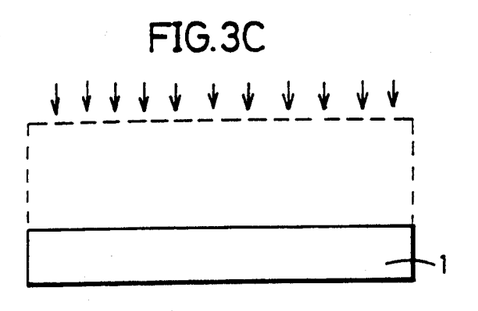

As shown in FIG. 3C, the resist 3 is etched until the surface of the underlying substrate 1 is exposed, in the oxygen plasma atmosphere instead of the gas plasma atmosphere. On this occasion, since the silicon in the resist is already removed, no resist remains as a residual.

In addition, since the oxygen plasma atmosphere contains no fluorine radical, the underlying substrate 1 comprising the device elements including the silicon never be damaged.

As the foregoing, by checking the registration by using the electron beams after the sililation and before the development of the resist, out-of-registration of the pattern is detected, so that the resist can be removed without damaging the underlying substrate in the case the removal of the resist is necessary.

After the complete removal of the resist, an additional resist is applied in accordance with the step A shown in FIG. 1 to refabricate a pattern.

Figure 4:
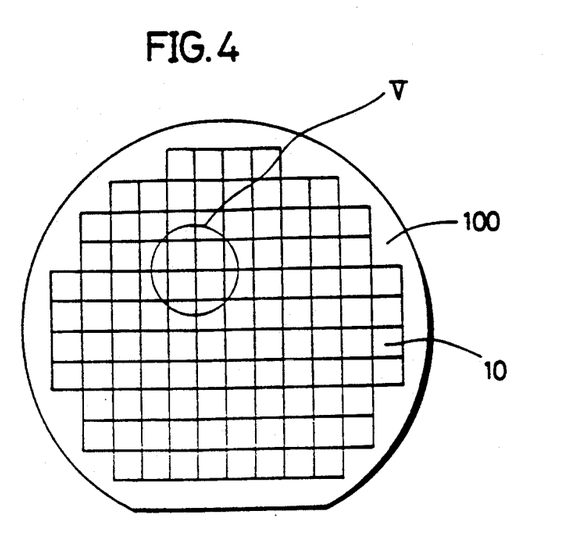
FIG. 4 is a schematic plan view showing a semiconductor wafer as an object on which a fine pattern is fabricated.
Figure 5:
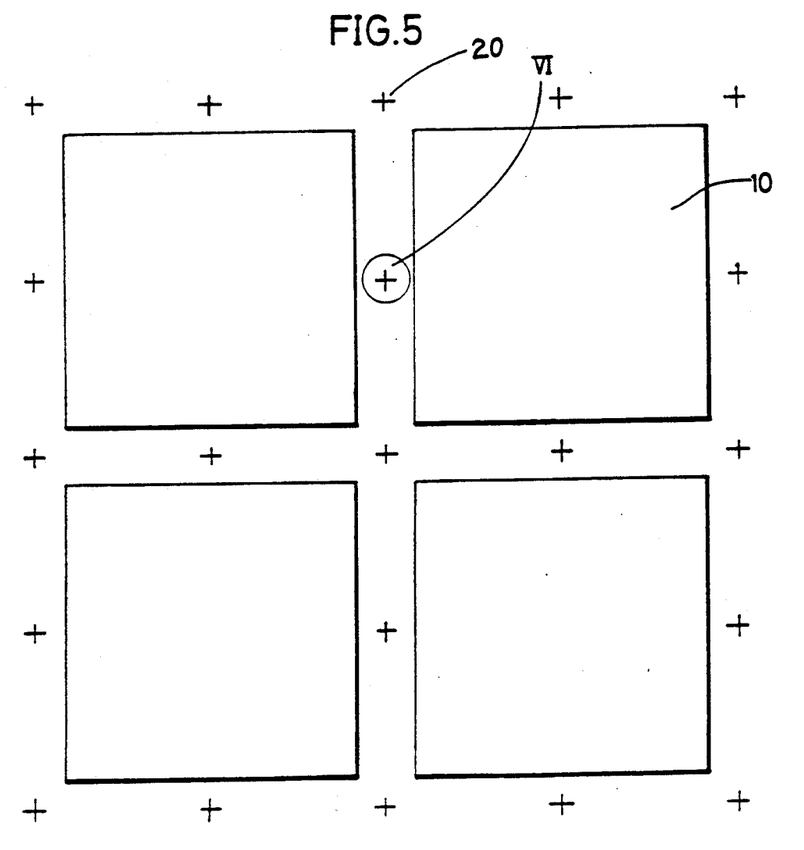
FIG. 5 is a plan view showing an enlarged portion indicated by V of FIG. 4.
Figure 6:
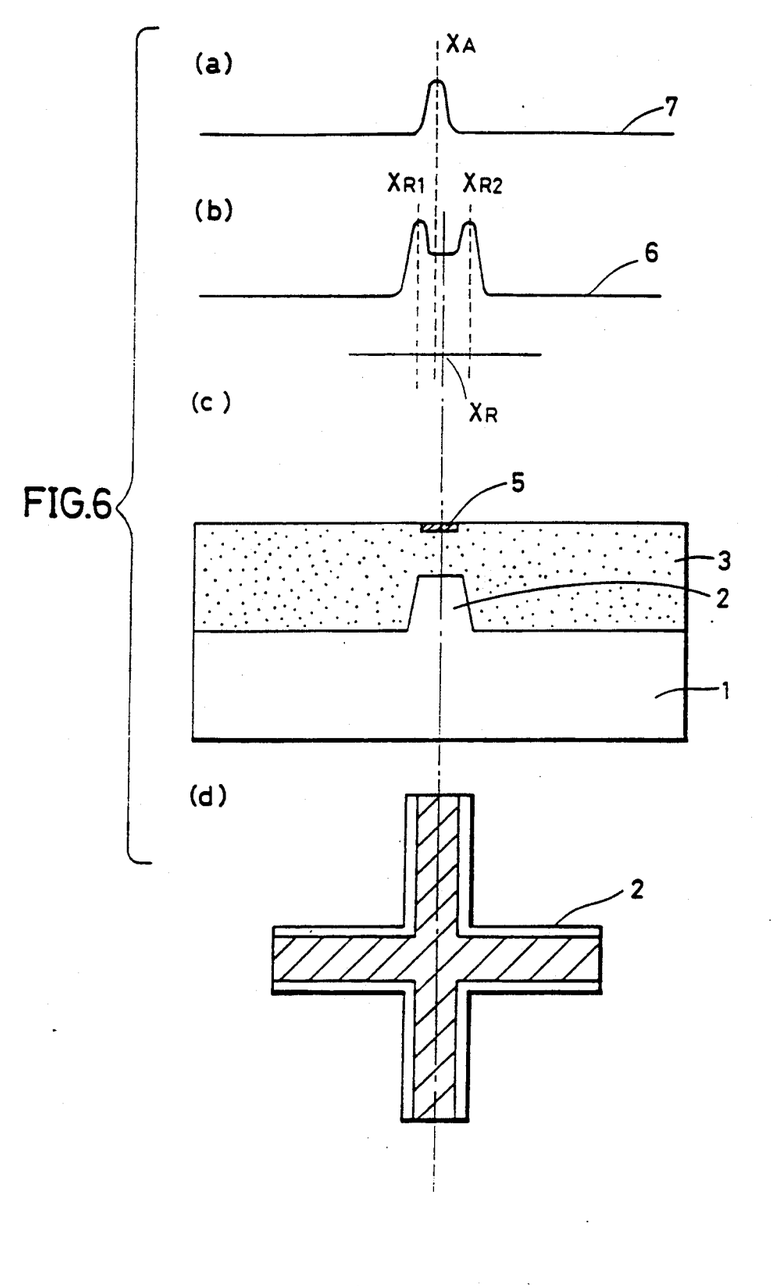
FIG. 6 is a schematic diagram showing a manner of checking registration accuracy by the electron beam scanning in accordance with the present invention.

Now, the method of checking the registration accuracy by the electron beam scanning according to the present invention will be described. Referring to FIG. 4, a plurality of chips 10 each becoming a semiconductor device are divisionally formed on a semiconductor wafer 100. FIG. 5 is a plan view showing the enlarged portion indicated by V of FIG. 4. Referring to FIG. 5, an alignment mark region 20 is formed in a boundary region of each chip 10. The alignment mark is used in forming a desired device pattern in each chip 10 as a mark indicative of a reference position for registering a mask having the pattern and the underlying substrate. FIG. 6, (d) shows an enlarged portion indicated by VI of FIG. 5. FIG. 6, (c) is a sectional view corresponding to the alignment mark of FIG. 6, (d).

Referring to FIG. 6, (c) (d) formed on the underlying substrate 1 is an alignment mark 2 comprising a stepped portion having a height of about 1.0 μm. As shown in FIG. 6, (c), at a stage in which checking the registration accuracy is performed by the electron beam scanning, the dry development resist 3 is spin-coated on the underlying substrate 1. In addition, since the dry development resist 3 is silylated, the silylated region 5 is selectively formed in the upper surface portion of the resist 3 so as to be located right above the alignment mark 2 as shown in FIG. 6 (c). The formation of the silylated region is possible by radiating the energy beams in transferring the pattern, such that in case of the ultraviolet light exposure, the position of the alignment mark 2 is exposed to ultra-violet light and in case of the electron beam exposure, the position of the alignment mark 2 is not exposed to the electron beam.

Checking the registration is carried out by scanning the resist 3 in a region including thus formed alignment mark 2 by the electron beams of about 20 keV. An Auger electron signal 7 can be obtained by detecting the electrons emitted from the silicon atoms included in the sililated portion 5 formed right above the alignment mark 2. By this electron beam scanning, an Auger electron signal 7 shown in FIG. 6 (a) and a reflected electron signal 6 shown in FIG. 6 (b) are obtained. $X_A$ denotes a peak position of the Auger electron signal 7. The reflected electron signal 6 can be obtained by detecting the electrons reflected from the stepped portion forming the alignment mark 2. The reflected electron signal comprises a signal having two peaks as shown in FIG. 6 (b). $X_{R1}$ and $X_{R2}$ denote the two peak positions. The middle position $X_R$ between the two peaks denotes the central position of the alignment mark 2, that is, it denotes a reference position of the underlying substrate 1. The peak position $X_A$ obtained by the Auger electron signal 7 denotes the central position of the sililated region 5, that is, a drawing position (transfer position) of the upper layer pattern. Accordingly, a gap between $X_A$ and $X_R$ detected from the two signals is detected as a gap in the alignment between the underlying substrate and the upper layer pattern. If the gap in the alignment is more than 0.1 μm in case of the ultra-violet light exposure and more than 0.05 μm in case of the electron beam exposure, for example, it is considered that the pattern is out of registration.

A method of detecting the Auger electron signal and the reflected electron signal used in the above-described check of the registration will be described.

Figure 7:
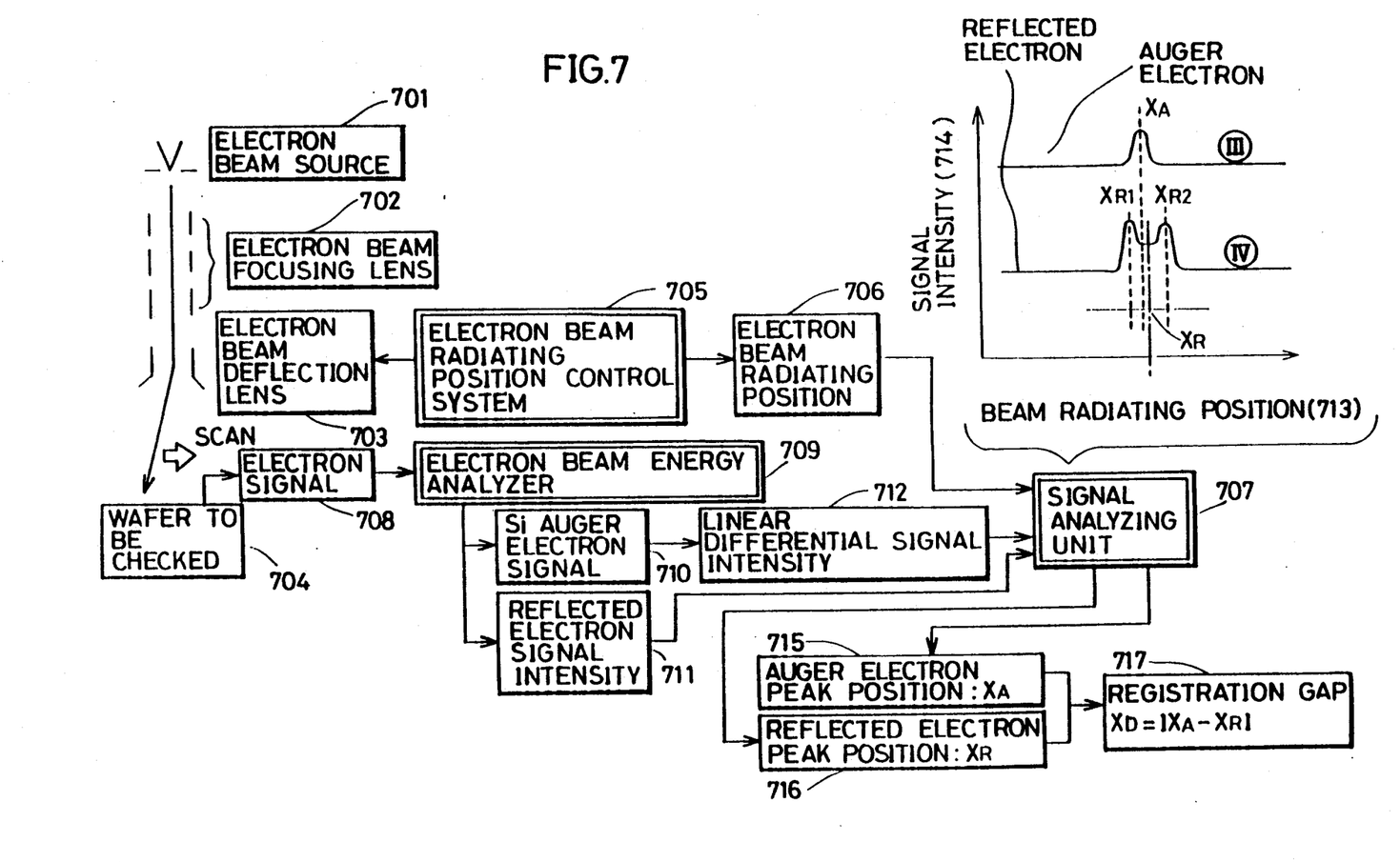
FIG. 7 is a block diagram showing an apparatus arranged for checking the registration according to the present invention.

Referring to FIG. 7, electron beam projected from an electron beam source 701 is focused into a desired size by an electron beam focusing lens 702 and then it is controlled to a desired position by an electron beam deflection lens 703, thereby scanning a wafer 704 to be checked. An electron beam radiating position control system 705 controls a position of the electron beam deflection lens 703. In addition, the position 706 to be irradiated by the electron beams is sent to a signal analyzing unit 707 from the electron beam radiating position control system 705. An electron signal 708 detected by scanning the wafer 704 to be checked with the electron beam is sent to an electron beam energy analyzer 709. The electron beam energy analyzer 7)9 processes the electron signal 708 based on intensity of a silicon Auger electron signal 710 and intensity of a reflected electron signal 711. The silicon Auger electron signal 710, after linearly differentiated (712), is sent to the signal analyzing unit 707. The intensity of the reflected electron signal 711 is sent to the signal analyzing unit 707 without being processed. In the signal analyzing unit 707, by analyzing the electron beam radiating position and two electron signal intensities, a linear differential signal intensity and a reflected electron signal intensity of the Auger electrons, a relation between a beam radiating position (713) and a signal intensity (714) as shown in FIG. 7 can be obtained. Thereafter, a position gap $X_D$ (717) is obtained by computing a difference between an Auger electron peak position $X_A$ (715) and a reflected electron peak position $X_R$ (716). Determination is made by the value of $X_D$ whether a gap in the registration of a pattern is within the limits or not.

Referring to FIGS. 8A through 8D, a procedure of checking the registration will be described.

Figure 8A:
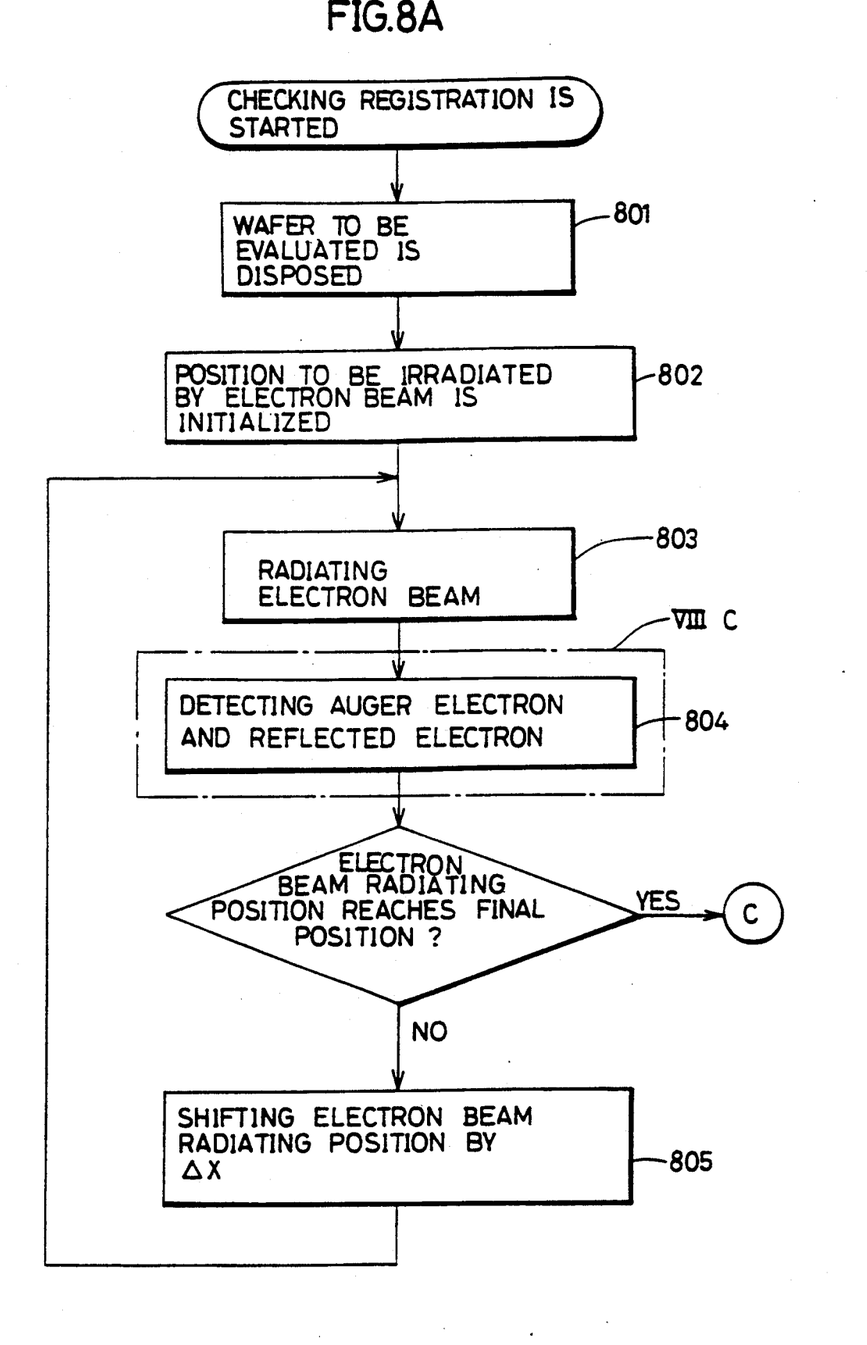
FIGS. 8A, 8B and 8C are flow charts showing steps of processes for checking the registration accuracy according to the present invention.
Figure 8B:
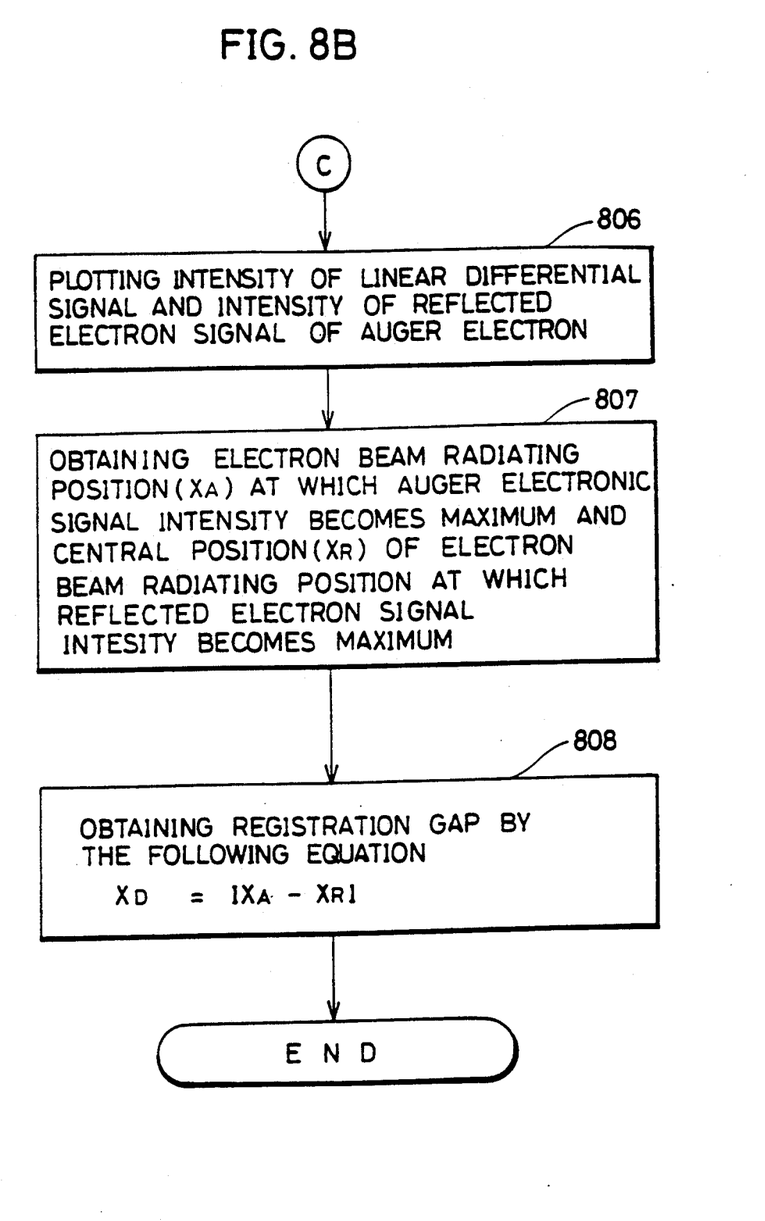

Referring to FIG. 8A, after the wafer to be evaluated is disposed at a predetermined position (Step 801), a position to be irradiated by the electron beams is initialized (Step 802). The electron beams controlled into a predetermined magnitude is emitted onto the wafer (Step 803). With the electron beams radiated on the predetermined position of the wafer, the Auger electrons and the reflected electrons are detected Step 804). If the electron beam radiating position does not coincide with the final position, by shifting the electron beam radiating position by x such that the electron beams are radiated with each position sequentially shifted (Step 805), the Auger electrons and the reflected electrons will be repeatedly detected. If the electron team radiating position reaches the final position, as indicated by C, the steps shown in FIG. 8B will be carried out. The intensity of the linear differential signal of the Auger electrons and the intensity of the reflected electron signal are plotted so as to correspond to the respective positions of the wafer irradiated by the electron beams (Step 806). An electron beam radiating position $X_A$ at which the Auger electron signal intensity becomes maximum and a central position $X_R$ of the electron beam radiating position at which the reflected electron signal intensity becomes maximum are obtained from a relation between the obtained signal intensities and the irradiated position (Step 807). By computing a difference between $X_A$ and $X_R$, a gap $X_D$ in the registration can be obtained (Step 808).

Figure 8C:
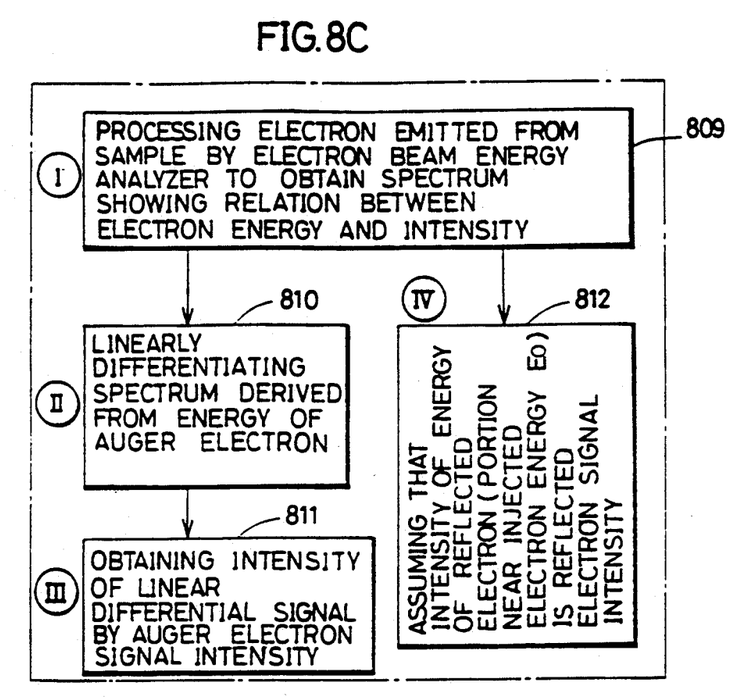

The process indicated by VIII C of FIG. 8A is carried out in accordance with the step shown in FIG. 8C. The electrons emitted from the semiconductor wafer as a sample are processed by the electron beam energy analyzer (Step 809). As a result, a spectrum (I of FIG. 8D) can be obtained showing a relation between electron energy and intensity. The spectrum can be obtained as a relation between an electron energy E and an intensity N. The intensity N changes with the value E of the electron energy and attains 0 at the injected electron energy $E_0$. The peak of the intensity indicative of the emission of the Auger electrons is detected at an electron energy value at which the Auger electrons of desired atoms, the silicon atoms herein, are emitted.

When inner shell electrons of atoms in a sample are excited by the electrons, generally characteristic X rays are emitted as an alleviation process thereof. However, sometimes the electrons are emitted. These electrons are referred to as Auger electrons. By measuring energy emitted by the Auger electrons, the identification of elements in substance can be made. In checking the registration according to the present invention, the energy emitted by the Auger electrons is measured to identify the silicon atoms included in the silylated region. Namely, the peak of the Auger electron intensity indicated by I of FIG. 8D shows the intensity corresponding to the energy of the Auger electrons emitted from the silicon atoms.

Figure 8D:
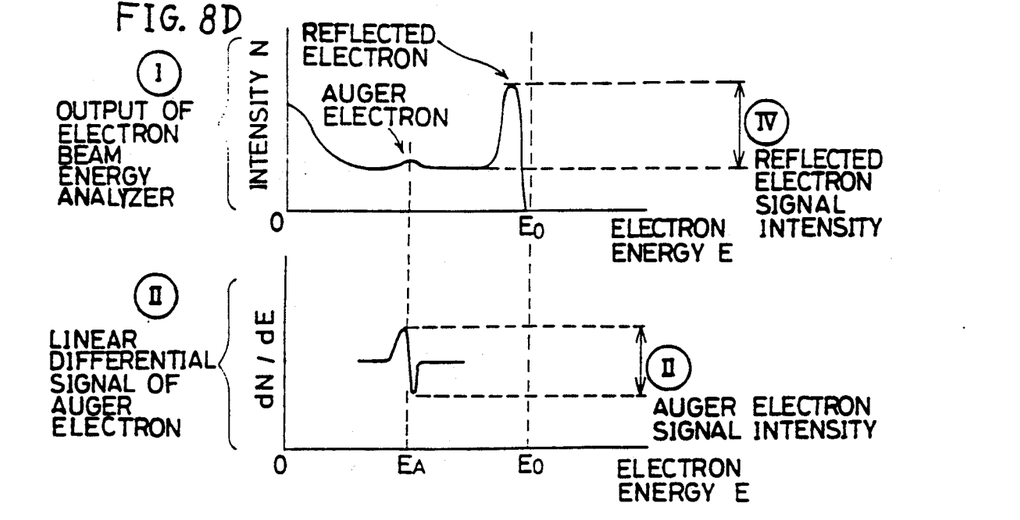
FIG. 8D is a graph showing a method of obtaining intensity of a reflected electron signal and intensity of an Auger electron signal.

The spectrum derived from the energy of the Auger electrons is linearly differentiated as shown in II of FIG. 8D (Step 810). The Auger electron signal intensity can be obtained by the linear differential signal of the Auger electrons as shown in III of FIG. 8I; (Step 811).

It is assumed that in the spectrum obtained as an output of the electron beam energy analyzer, intensity of the energy of the reflected electrons (a portion near the primary electron energy $E_0$) denotes reflected electron signal intensity (Step 812). The reflected electron signal intensity is shown in VI of FIG. 8D.

As the foregoing, relations of the Auger electron signal intensity III and the reflected electron signal intensity IV with respect to the beam radiating position can be obtained as shown by the graph of FIG. 7.

In the above described embodiments, while the description is made of a case in which the method of checking the registration according to the present invention is applied to a process of forming a silylated region including the silicon atoms in a surface portion of the resist, that is, it is applied to a DESIRE process, the present invention can be also applied to a resist pattern fabricating process for forming a surface layer including other elements in the surface portion of the resist. In other words, the method of checking the registration according to the present invention is applicable to any resist pattern fabricating process in which a surface layer including the elements by which at least the Auger electron signals can be detected is formed on a surface of the resist. As such surface layer as is formed in the surface of the resist, the process of forming a $TiO_2$ film, other than the silylation process is reported in "Polymer Surface: Their Role in High Resolution Imaging" by Gary N. Taylor et al., PME,89 (Oct. 29 to Nov. 2, 1988), Tokyo.

As the foregoing, according to the present invention, the registration can be checked before developing a pattern. Since at this stage, a resist pattern is not formed yet, the surface of the underlying substrate is not exposed. Therefore, the resist can be removed by etching and the like without damaging the underlying substrate when out-of-registration is detected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a fine pattern by using selective surface reaction, comprising the steps of:

applying a resist on a major surface of a substrate at least comprising an alignment mark formed at a predetermined reference position and having a stepped portion, transferring a predetermined pattern onto said resist by selectively radiating electron beams onto said resist in accordance with said pattern with reference to the position of said alignment mark, selectively forming a surface layer of high etchingresistant on said resist, checking the registration of the position of said alignment mark with the position of said surface layer formed in the region of said alignment mark by scanning said resist in the region at least including said alignment mark by the electron beams after the formation of said surface layer and before the development of the pattern transferred onto said resist, said step of checking the registration including detecting the position of said surface layer by the detection of Auger electrons emitted from silicon atoms penetrated into the surface of said resist, and developing said pattern transferred onto the resist by selectively removing said resist by using said surface layer as a mask.

2. The method of fabricating a fine pattern according to claim 1, wherein said step of forming the surface layer comprises forming a surface layer highly resistant to etching with respect to oxygen plasma by causing a silylation reaction such that the silicon atoms selectively penetrate into the surface of said resist.

3. The method of fabricating a fine pattern according to claim 2, wherein selective penetration of the silicon atoms into the surface of said resist is induced by energy beam radiation.

4. The method of fabricating a fine pattern according to claim 3, wherein said energy beam radiation is performed by selectively radiating ultra-violet light in said step of transferring the pattern onto the resist.

5. The method of fabricating a fine pattern according to claim 3, wherein said energy beam radiation includes irradiating the whole surface with ultra-violet light after selectively radiating the electron beams in said step of transferring the pattern onto the resist.

6. The method of fabricating a fine pattern according to claim 1, wherein said step of developing the pattern transferred on the resist includes etching said resist in anisotropic oxygen plasma atmosphere.

7. The method of fabricating a fine pattern according to claim 6, wherein said etching includes reactive ion etching.

8. The method of fabricating a fine pattern according to claim 6, wherein said step of checking the registration further comprises the step of:
  detecting the position of said alignment mark by detecting the electrons reflected form said stepped portion.

9. A method of fabricating a fine pattern by using selective surface reaction, comprising the steps of:
  applying a resist on a major surface of a substrate having an alignment mark formed at a predetermined reference position thereon,
  transferring a predetermined pattern onto said resist with reference to the position of said alignment mark,
  selectively forming a surface layer of high etchingresistant on said resist,
  checking the registration of the position of said alignment mark with the position of said surface layer formed in the region of said alignment mark after the formation of said surface layer and before the development of the pattern transferred onto said resist,
  if said alignment mark and said surface layer are determined in the previous step to be in mis-registration, removing said resist, and
  if said alignment mark and said surface layer are determined in the previous step not to be in misregistration, developing said pattern onto the resist by using said surface layer as a mask for selectively removing said resist.

10. The method of claim 9, wherein said step of removing said resist comprises the steps of
  removing only an upper layer of said resist by etching by a gas plasma containing a constituent capable of removing said etch resistant substance, and
  removing an additional layer of said resist by etching by an oxygen plasma.

11. The method of claim 10, wherein said resist is a dry development resist, said etch resistant substance is a silicide, and said gas plasma includes a fluorine radical capable of removing silicon.

12. The method of claim 9, wherein said step of checking includes scanning said substrate with an energy beam and detecting energy received therefrom.

13. The method of claim 12, wherein said energy beam comprises an electron beam, and energy from said etch resistant substance comprises Auger electrons.

14. A method of inspecting a fine pattern fabricated with reference to a position of an alignment mark having a stepped portion, the fine pattern including a surface layer containing predetermined atoms, comprising the steps of:
  detecting a position of said surface layer by the detection of Auger electrons emitted from said predetermined atoms by means of electron beams,
  detecting a position of said alignment mark by the detection of the electrons reflected form said stepped portion by means of electron beams, and
  checking before the development of the fine pattern the registration of the position of said alignment mark with the position of said surface layer formed in the region of said alignment mark.

15. A method of detecting a registration gap between a layer containing predetermined atoms formed on a substrate and a mark having a stepped portion formed on the substrate, comprising the steps of:
  detecting a position of said layer by the detection of Auger electrons emitted from said predetermined atoms by means of electron beams,
  detecting a position of said mark by the detection of the electrons reflected from said stepped portion by means of electron beams, and
  measuring the registration gap between the position of said mark and the position of said layer formed in the region of said mark.

* * * * *